United States Patent [19]

Wada et al.

[11] Patent Number: 4,675,074
[45] Date of Patent: Jun. 23, 1987

[54] METHOD OF MANUFACTURING SEMICONDUCTOR DEVICE

[75] Inventors: Masaru Wada, Takatsuki; Hirokazu Shimizu, Suita; Takao Shibutani, Takatsuki; Kunio Itoh, Uji; Ken Hamada, Toyonaka; Iwao Teramoto, Ibaraki, all of Japan

[73] Assignee: Matsushita Electric Industrial Co., Ltd., Osaka, Japan

[21] Appl. No.: 761,023

[22] Filed: Jul. 31, 1985

[30] Foreign Application Priority Data

Jul. 31, 1984 [JP] Japan ............................ 59-161717
Aug. 1, 1984 [JP] Japan ............................ 59-161862

[51] Int. Cl.$^4$ ..................... H01L 21/306; B44C 1/22; C03C 15/00; C03C 25/06
[52] U.S. Cl. ..................... 156/647; 29/569 L; 29/580; 148/175; 357/17; 357/55; 357/56; 156/649; 156/655; 156/659.1; 156/662; 252/79.2; 372/43
[58] Field of Search ............... 29/569 L, 580; 357/16, 357/17, 30, 55, 56; 148/175; 372/43, 44, 48, 50; 156/647, 649, 651, 655, 659.1, 662; 252/79.2

[56] References Cited

U.S. PATENT DOCUMENTS

| 4,029,531 | 6/1977 | Marinell | 156/647 |
| 4,213,805 | 7/1980 | Tsukada | 156/649 X |
| 4,341,010 | 7/1982 | Tijburg et al. | 156/649 X |
| 4,354,898 | 10/1982 | Coldren et al. | 156/647 |

Primary Examiner—William A. Powell
Attorney, Agent, or Firm—Wenderoth, Lind & Ponack

[57] ABSTRACT

The invention provides a chemical etching method for a semiconductor device, which comprises a step of forming a first layer of $Ga_{1-x}Al_xAs$ ($0 \leq x < 1$) having a surface (100), a step of forming on the first layer a second layer of $Ga_{1-y}Al_yAs$ ($0 \leq y < 1$) having a surface (100), and a step of chemically etching the layers from a level above the second layer and along the direction of $<011>$. The slope angle of etch face of the second layer depends on the mol fraction y of the second layer, and the slope angle of etch face of the first layer depends on the mol fraction y of the second layer and the mol fraction x of the first layer. These facts are best utilized in the invention so that the etch profile of the first layer may have a desired slope angle. By utilizing this chemical etching method it is possible to produce by chemical etching a semiconductor laser having a flat cavity facet perpendicular to a junction; it is also possible to provide an inner stripe type semiconductor laser having grooves whose side walls are perpendicular.

19 Claims, 21 Drawing Figures

| AlAs | (011) plane | AlAs | (011) plane |
|---|---|---|---|
| 0 | | 0.4 | |
| 0.1 | GaAlAs / GaAs | 0.5 | |
| 0.2 | | 0.6 | |
| 0.3 | | 0.7 | |

Light output

METHOD OF MANUFACTURING SEMICONDUCTOR DEVICE

BACKGROUND OF THE INVENTION

The present invention relates to a method of manufacturing semiconductor devices, and more particularly to a manufacturing method suitable for mass production of semiconductor lasers and the like.

For the purpose of realizing optical integrated circuits or short cavity lasers, the development of cavity surface forming techniques other than the so-called cleavage method is essential. To this end, numerous research and development efforts have been made for cavity profile formation through wet etching, dry etching, or microcleavage. More specifically, in the area of AlGaAs/GaAs - based systems, research on chemical etching techniques has been conducted. These approaches have been intended to produce a specular surface which is smooth and perpendicular to wafer surface (100), by changing etchant compositions in various ways. However, all these attempts have failed to produce such good cavity face as may be comparable to one obtainable through the cleavage method; etched cavity lasers thus far produced through such approaches are such that the threshold current density is so high and external differential efficiency is so low that they are far from being of a serviceable level; as such, all those attempts have been technically at a standstill.

On the other hand, there is a need for semiconductor lasers which are able to oscillate in a foundamental transverse mode and with a low threshold current, thus serving as a light source for data storing into or reading information from DAD, optical desk files, and the like. As one approach to meet such demand, it is known to incorporate a built-in current narrowing mechanism (inner stripe) and distributed index into a laser structure by utilizing two-times growth techniques. With conventional etching techniques, however, the GaAs etch characteristics, where chemical etching techniques are used, do not provide vertical groove side walls, the side walls being sloped at an angle of about 60° C. Light coming out from an active layer is absorbed at such slope, with the result of greater loss of light; as such, the conventional laser structure is too unfavorable to achieve high output.

SUMMARY OF THE INVENTION

We have now found a novel method of chemical etching, which has enabled us to develop a GaAlAs/GaAs laser having an etched cavity facet comparable favorably to a cavity facet produced by the cleavage method. By this chemical etching method we have also succeeded in constructing a high-output inner stripe type laser having a vertical facet. The chemical etching method takes advantage of a certain relationship between crystal anisotropy in etched walls and Al mol fraction in multilayer heterostructures; and by employing such chemical etching method it is possible to obtain an etched wall having an arbitrary slope angle.

Therefore, it is a primary object of the invention to provide a semiconductor device manufacturing method which makes it possible by chemical etching to arbitrarily control the slope angle of the etch profile of a $Ga_{1-x}Al_xAs$ (where $0 \leq x > 1$) layer.

It is a second object of the invention to provide a semiconductor laser manufacturing method which permits formation by chemical etching of a flat cavity profile perpendicular to a junction in a semiconductor laser.

It is a third object of the invention to provide a method of manufacturing a semiconductor laser which permits formation by chemical etching of a perpendicular and flat cavity profile, whether the laser is an infrared region oscillation laser or a visible region oscillation laser.

It is a fourth object of the invention to provide a method of forming a cavity profile for a semiconductor laser which permits a monolithic integration of the semiconductor laser and elements such as detectors and drive circuit as in an optical integrated circuit.

It is a fifth object of the invention to provide a semiconductor laser cavity profile forming method which makes it possible to manufacture a short cavity laser.

It is a sixth object of the invention to provide a semiconductor laser manufacturing method which permits the formation of a passivation for a laser facet by a batch process.

It is a seventh object of the invention to provide a semiconductor laser manufacturing method which permits characteristic testing of a laser as in the form of a wafer.

It is an eighth object of the invention to provide a semiconductor laser manufacturing method which makes it possible to produce by chemical etching an inner stripe type semiconductor laser having grooves defined by vertical side walls.

It is a ninth object of the invention to provide a semiconductor laser manufacturing method by which it is possible to manufacture a high output inner stripe type semiconductor laser.

These and other objects are accomplished by a chemical etching method for semiconductor devices which comprises a step of forming a first layer of $Ga_{1-x}Al_xAs$ (where $0 \leq x < 1$) having a surface (100), a step of forming on said first layer a second layer of $Ga_{1-y}Al_yAs$ (where $0 \leq y < 1$) having a surface (100), and a step of chemically etching the layers downwardly from said second layer and along the direction of $<011>$, the Al mol fraction y for said second layer bring suitably determined relative to the Al mol fraction x for said first layer so that the etching profile of the first layer may have a desired angle of inclination.

This invention also relates to a semiconductor laser device manufacturing method comprising the steps of: forming on a semiconductor substrate having a surface (100) a first cladding layer of $Ga_{1-x}Al_xAs$ (where $0 < x < 1$), an active layer of $Ga_{1-y}Al_yAs$ (where $0 \leq y < 1$), a second cladding layer of $Ga_{1-x}Al_xAs$ (where $0 < x < 1$), a contact layer of GaAs, and a layer of $Ga_{1-z}Al_zAs$ (where $0 < z < 1$) having a Al mol fraction z such that its difference from the Al mol fraction x of said two cladding layers is larger than 0 and smaller than 0.2, and forming a cavity profile by chemically etching the layers downwardly from said layer of $Ga_{1-z}Al_zAs$ along the direction of $<011>$.

In this connection it is noted that for the purpose of chemical etching along the direction of $<011>$ a mask is formed which has edges oriented along the direction of $<011>$, etching being effected through the mask.

A mixed solution of $H_2SO_4$, $H_2O_2$, and $H_2O$ is used as an etchant in the chemical etching.

This invention further relates to a semiconductor laser device manufacturing method comprising the steps of forming on a GaAs layer formed on a semiconductor substrate and having a surface (100) a layer of $Ga_{1-x}Al_xAs$ having a Al mole fraction x suitably determined as such, chemically etching the layers downwardly from said layer of $Ga_{1-x}Al_xAs$ along the direction of <011>, thereby forming grooves bottomed on said semiconductor substrate, and forming above the grooves a plurality of layers including an active layer. The semiconductor substrate is a GaAs semiconductor substrate having a surface (100), on which substrate is epitaxially grown a GaAs layer having a surface (100).

The Al mole fraction x is expressed by the relation $0.1 < x < 0.6$.

It is noted that for the purpose of chemical etching along the direction of <011> a mask is formed which has edges oriented along the direction of <011>, etching being effected through the mask.

A mixed solution of $H_2SO_4$, $H_2O_2$, and $H_2O$ is used as an etchant in the chemical etching.

The plurality of layers include, from bottom and upward, a p-type GaAlAs cladding layer, a nondope GaAlAs active layer, an n-type GaAlAs cladding layer, and an n-type GaAs cap layer, the layers being successively grown one over another.

This invention provides various advantages among which are as follows:

(1) that the angle of an etching profile can be arbitrarily controlled by chemical etching;

(2) that it is possible to form by chemical etching a flat cavity facet perpendicular to a junction in a semiconductor laser;

(3) that whether the laser is an infrared region oscillation laser or a visible region oscillation laser, it is possible to form by chemical etching a perpendicular and flat cavity facet;

(4) that a semiconductor laser and elements such as detectors and drive circuit can be monolithically integrated as in an optical integrated circuit;

(5) that it is possible to manufacture a short cavity laser;

(6) that formation by batch processing of a protection layer for a laser end face is made possible;

(7) that characteristic testing of a laser as in the form of a wafer is possible;

(8) that by chemical etching it is possible to produce an internal stripe type semiconductor laser having grooves defined by vertical side walls; and (9) that aforesaid inner stripe type semiconductor laser is of high output because it has grooves defined by vertical side walls.

While the novel features of the invention are set forth with particularity in the appended claims, the invention, both as to organization and content, will be better understood and appreciated, along with other objects and features thereof, from the following detailed description taken in conjunction with the drawings.

DETAILED DESCRIPTION OF THE INVENTION

Figures 1, 2:
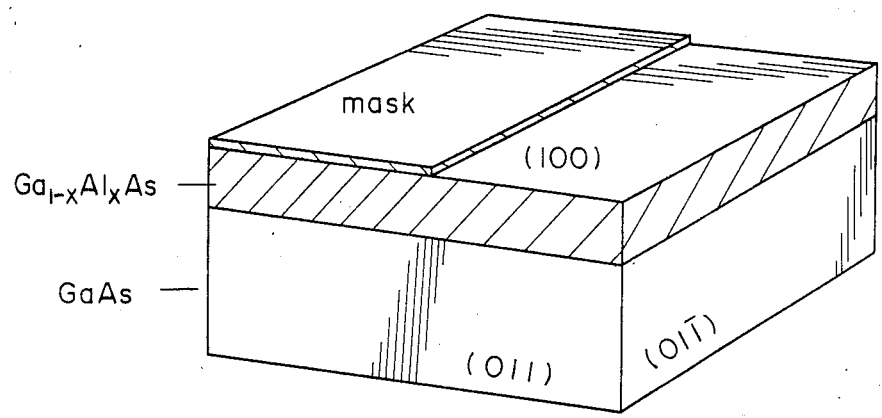
FIG. 1 is a perspective view of a semiconductor device employed in fundamental experiments for the invention.
FIG. 2 is a view showing etching profiles based on fundamental experiments for the invention.

The present inventors found that where a plurality of $Ga_{1-x}Al_xAs$ laid one over another and having different Al mol fraction x are chemically etched, the slope angle of the etched end surface of each respective $Ga_{1-x}Al_xAs$ layer depends largely on x of the layer and x of another $Ga_{1-x}Al_xAs$ layer formed thereon. As illustrated in FIG. 1 by way of a fundamental experiment, layers of $Ga_{1-x}Al_xAs$ were grown on a GaAs substrate to form a stripe-form photomask having edges along the direction of <011>. The layers were subjected to etching with an etchant of $1H_2SO_4: 8H_2O_2: 1H_2O$ at 20° C. for 3 minutes. The etching profile was observed from the cleavage plane <011>.

Figure 3A:
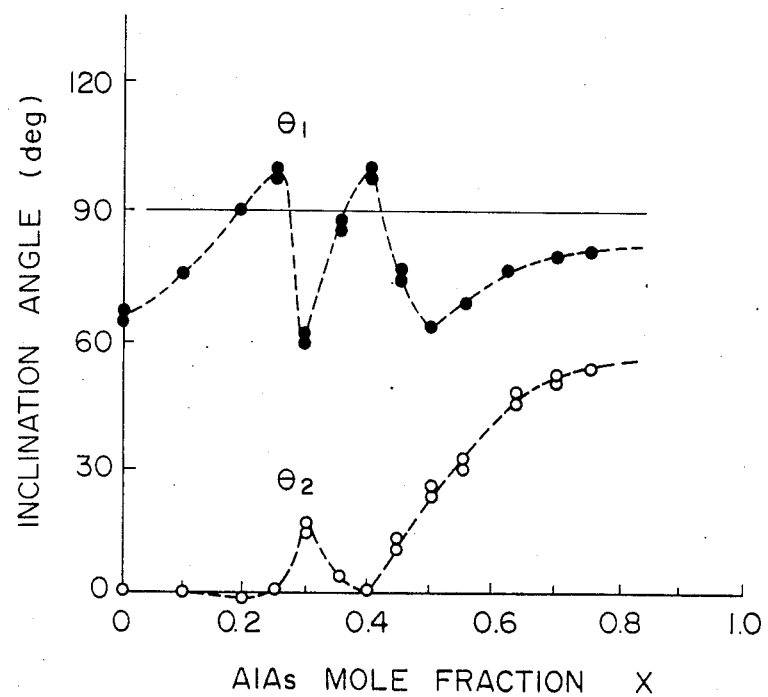
FIGS. 3a, 3b, 4a and 4b are diagrammatic views showing the relationship between Al mol fraction and etch surface slope angles.
Figure 3B:
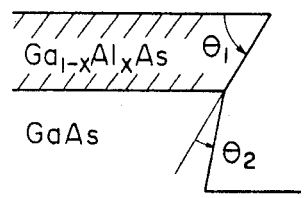

In FIG. 2 there are shown etching profiles where the Al mol fraction is varied. It can be seen that the etching profile varies depending upon the Al mol fraction x. Where x=0.2 and x=0.4, the etch profile of the $Ga_{1-x}Al_xAs$ layers is substantially perpendicular. If x=0.5, the etching profile of the $Ga_{1-x}Al_xAs$ is inclined, but the etching profile of the GaAs substrate is perpendicular. FIG. 3(a) illustrates the relationship between Al mol fractions and etched edge face inclinations $\theta_1$, $\theta_2$. As shown in FIG. 3(b), $\theta_1$ denotes a slope of the GaAlAs layers and $\theta_2$ denotes a bend angle at the interface between the GaAlAs layers and the GaAs substrate. Slope $\theta_1$ varies considerably depending upon the value of x; where x=0.2 and x=0.4 or so, the slope angle is 90° or above, the etching profile being thus of a positive mesa configuration. It can also be seen that bend angle $\theta_2$ largely varies depending upon the value of x. All this means that the slope of etched edge face of the GaAs substrate depends on the composition of the GaAlAs layers formed on the substrate.

Figure 4A:
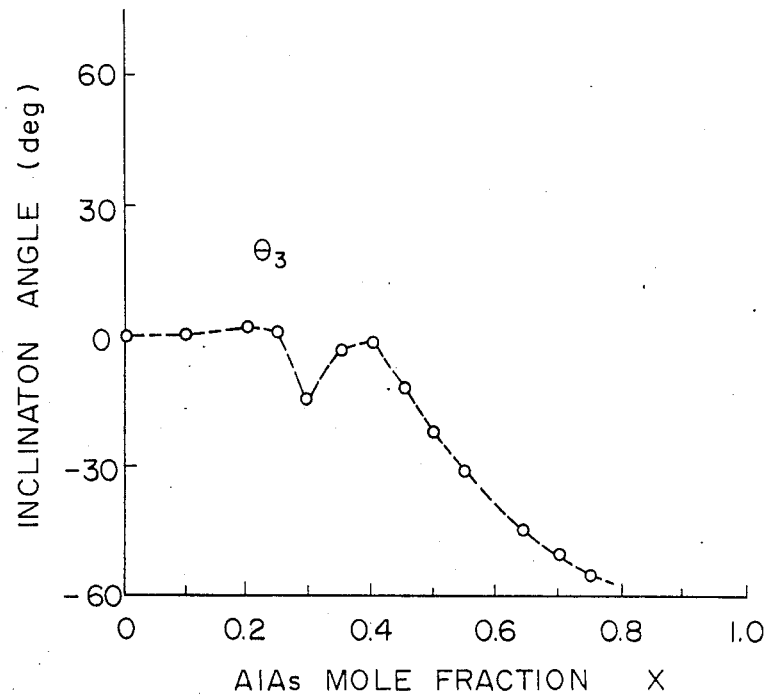
Figure 4B:
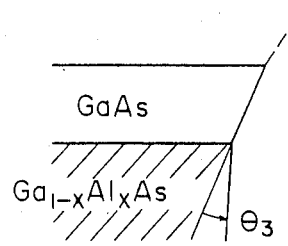

Experiments were also made with the case in which a GaAs layer was grown on $Ga_{1-x}Al_xAs$ layers. The results obtained are shown in FIG. 4. As can be seen from the figure, bend angle $\theta_3$ of the etching profile [see FIG. 4(b)] depends on the x; it takes a negative value when oriented as shown.

Where two layers of $Ga_{1-x}Al_xAs$ having different Al mol fraction (x=0) are grown, the slope angle of etch face of the upper layer depends on x of the upper layer, and the slope angle of etching face of the lower layer depends on both x of the lower layer and x of the upper layer.

As can be appreciated from these facts, the slope angle of the etched edge face is dependent on x of each layer placed on another. By taking advantage of this characteristic it has now become possible to produce by chemical etching a semiconductor laser device having perpendicular and flat cavity surfaces. Further, it is possible to provide a stripe type laser having groove side-walls formed in perpendicular relation by chemical etching.

A first example of the method of the invention will now be explained which represents an application of the method for cavity profile preparation.

Figure 5A:
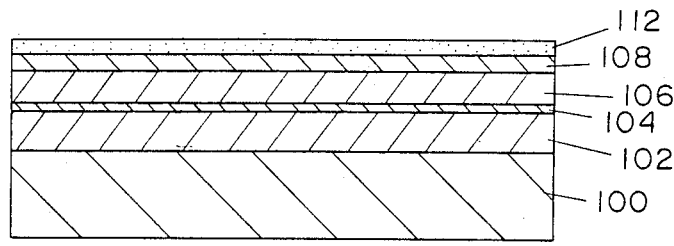
FIGS. 5a and 5b are sectional views showing the process of manufacturing a semiconductor laser device which represents a first example of the method of the invention.

As FIG. 5(a) shows, an n-type $Ga_{0.6}Al_{0.4}As$ cladding layer 102, a GaAs active layer 104, a p-type $Ga_{0.6}Al_{0.4}As$ cladding layer 106, and a p-type GaAs contact layer 108 are successively grown on an n-type GaAs (100) substrate 100.

Figure 5B:
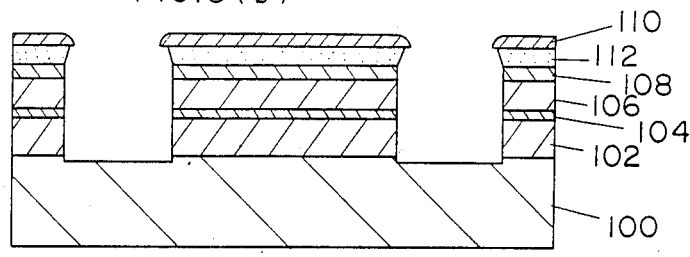
Figure 6A:
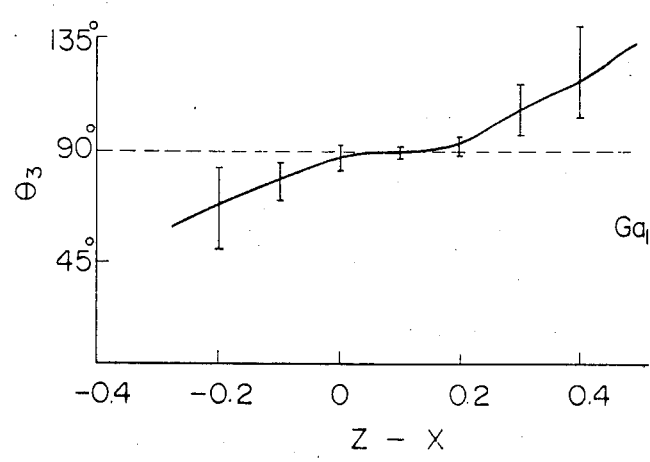
FIGS. 6a and 6b are diagrammatic views showing the relationship between Al mol fraction differentials (z-x) and cavity surface inclination angles in such device.
Figure 6B:
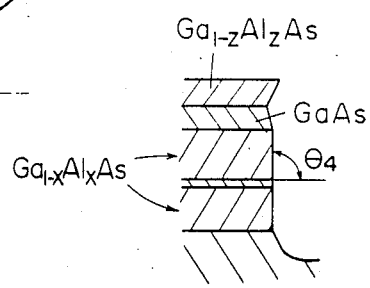

Generally, a semiconductor laser is of such four-layer construction; in this example, however, a fifth layer 112 of $Ga_{1-z}Al_zAs$ is provided on the p-type GaAs contact layer. A stripe-form photomask 110 is formed on the fifth layer and along the direction of <011>, and etching is performed through the mask and down to the GaAs substrate 100 [FIG. 5(b)]. It has been found by the present inventors that for perpendicular etching of the p-type cladding layer 106 and the lower layers, the difference in Al mol fraction (z-x) between the fifth layer 112 of $Ga_{1-z}Al_zAs$ formed on the GaAs contact layer 108 and the $Ga_{1-x}Al_xAs$ cladding layer 106 must be within a certain range. FIG. 6(a) shows the relationship between the Al mol fraction differential z-x and the slope of etched edge face of the clad layer 106 [see FIG. 6(b)]. As is apparent from FIG. 6(a), $\theta_4$ is 90° where z-x is 0-0.2. This fact is very important, because it means that a perpendicular cavity profile is obtainable by chemical etching. That is, whatever the value of Al mol fraction x of the $Ga_{1-x}Al_xAs$ cladding layers 102, 106 may be, a perpendicular etch profile can be obtained depending upon the mixed crystal ratio z of the fifth $Ga_{1-z}Al_zAs$ layer. The fact that the Al mol fraction of the cladding layers is arbitrarily variable means that the composition of the active layers, or oscillation wave length thereof may be freely designed. According to the present invention, therefore, it is possible to obtain a perpendicular and flat cavity profile, whether the lase is of an infrared region oscillation type or a visible region oscillation type. Further, it is to be noted that there is no variation in slope angle between the cladding layers 106, 102 and the active layer 104. This may be due to the fact that the active layer 104 is of a very thin formation.

Figure 7:
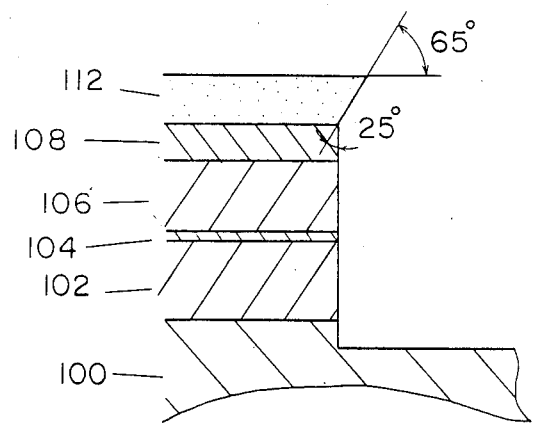
FIG. 7 is a view showing the inclination of cavity facet of the device.

The example will be explained in further detail. As FIG. 7 shows, an n-type $Ga_{0.6}Al_{0.4}As$ cladding layer 102 (1.5μ), a nondope $Ga_{0.9}Al_{0.1}As$ active layer 104 (0.1μ), a p-type $Ga_{0.6}Al_{0.4}As$ cladding layer 106 (1.5μ), a p-type GaAs contact layer 108 (0.5μ), and a nondope $Ga_{0.5}Al_{0.5}As$ fifth layer 112 (1.0μ) were sequentially formed on an n-type GaAs substrate 100 having a surface (100). In this instance, the Al mol fraction x of the clad layers 102, 106 was 0.4, and the mixed crystal ratio z of the fifth layer 112 was x+0.1, that is, 0.5.

Figure 8:
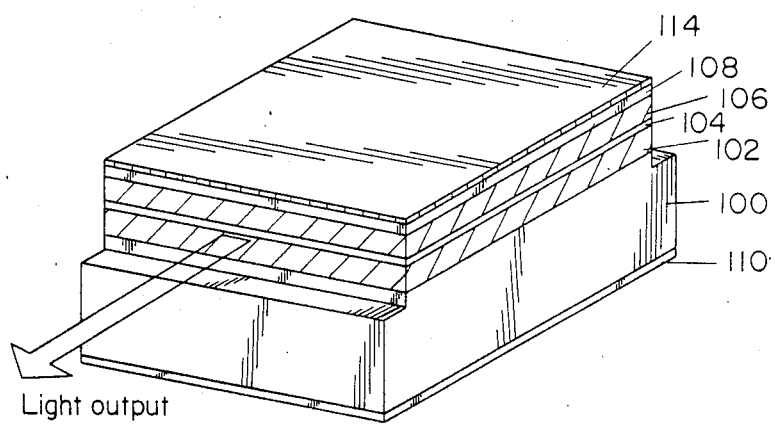
FIG. 8 is a perspective view of the device.

Then, through a stripe-form photomask formed on the fifth layer 112 and along the direction of <011>, etching was performed with a sulfuric acid-based etchant ($H_2SO_4$; $H_2O_2$; $H_2O$=1:8:1), and a perpendicular facet profile was thus obtained. Subsequently, the fifth layer 112 was selectively etched for removal, and on the p-type GaAs contact layer 108 thus exposed was formed a positive electrode 114, with a negative electrode 116 formed on the substrate side; then, groove etching was performed and thus a semiconductor laser device having such perpendicular facet profile as shown in FIG. 8 was obtained.

Figure 9:
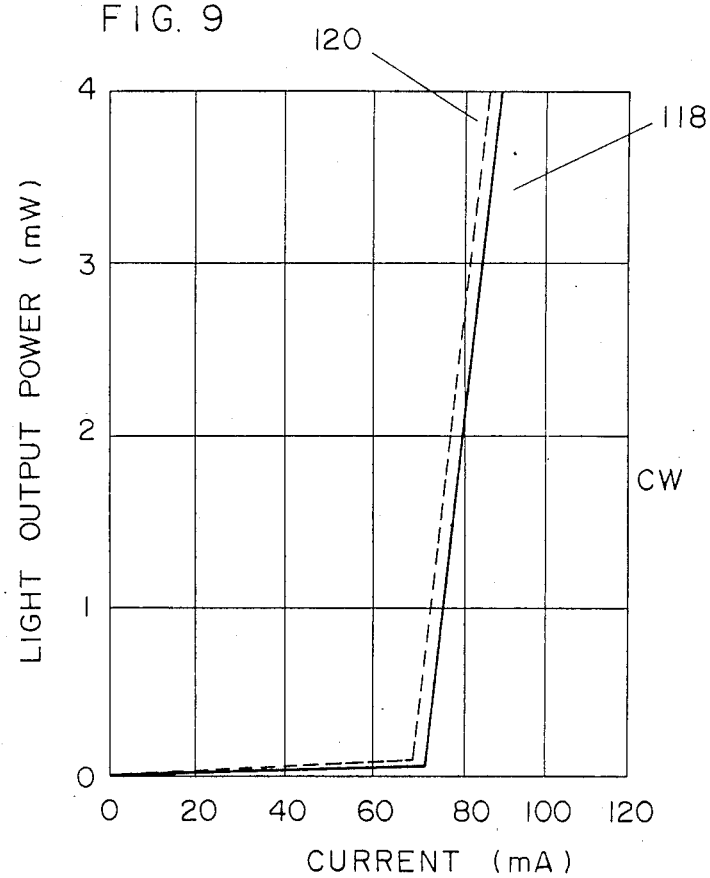
FIG. 9 is a diagrammatic view showing a current/optical output relationship in the device.

FIG. 9 shows optical output-current characteristics of the semiconductor laser device produced in the example. In FIG. 9, numeral 118 indicates the characteristics of the laser device obtained according to the invention, and 120 indicates the characteristics of a laser obtained by the cleavage method. As can be seen from the figure, the laser according to the invention manifests a very high yield on a continuous oscillation basis, with a typical threshold oscillation value of 72 mA (against 70 mA with the laser obtained by the cleavage method) and a differential quantum efficiency of 29% per facet (against 30% with the one according to the cleavage method), which tells that the characteristics of the laser according to the invention are well comparable to those of the cleavage method laser.

As above described, the chemical etching method for semiconductor devices in accordance with the invention makes it possible to produce by chemical etching a flat facet profile perpendicular to a junction. The fact that a facet profile equivalent to a cleavage face can be obtained by chemical etching provides various advantages including: that the semiconductor device can be readily integrated with other elements on one substrate; that the method of the invention can be employed in manufacturing a short cavity laser; that passivation film formation for the protection on the facet may be effected on a batch operation basis; and that probe tests may be made of the laser in its wafer state. All these advantages are of great significance from a practical viewpoint.

Nextly, a second example of the method of the invention will be described with reference to the relevant drawings.

FIGS. 10(a)-(d) are sectional views showing individual steps involved in the manufacture of a semiconductor laser, in the second example.

Figure 10A:
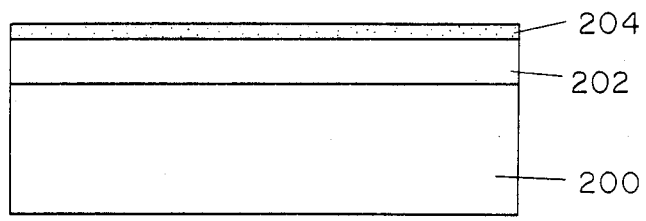
FIGS. 10(a, b, c, d) are sectional views showing the process of manufacturing a semiconductor device which represents a second example of the method of the invention.
Figure 10B:
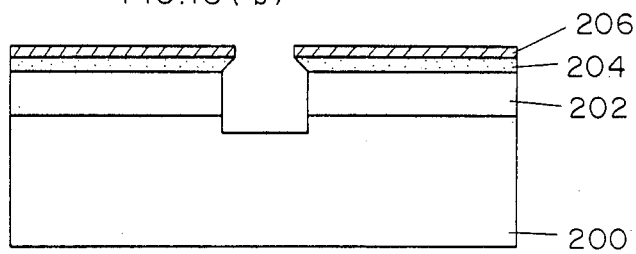
Figure 10C:
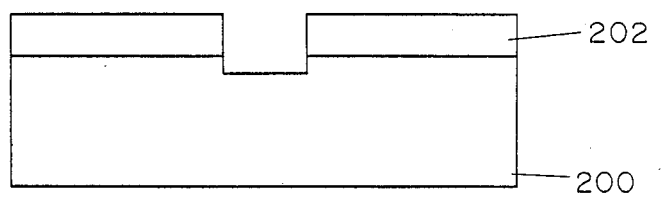
Figure 10D:
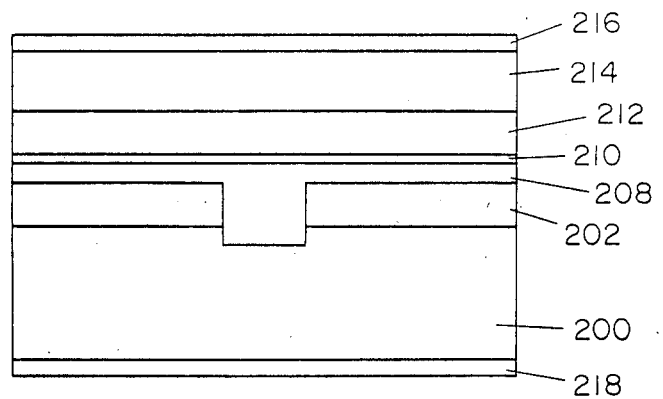

An n-type GaAs current narrowing layer 202 and a nondope $Ga_{1-x}Al_xAs$ layer 204 were sequentially grown to 0.7 μm thick and 0.3 μm thick respectively on a p-type (100) GaAs substrate 200 by a liquid-phase epitaxial method [FIG. 10(a)]. On the surface of the wafer of which the first growth was thus completed were formed grooves through a photomask 206 and in parallel to the direction of <011>, said grooves extending down to the substrate 200 [FIG. 10(b)]. In this conjunction it is noted that, as shown in FIG. 3, the slope angle of etch face of the GaAs layer is dependent on the Al mol fraction x of the $Ga_{1-x}Al_xAs$ layer on the GaAs layer, and that as is apparent from the drawing the slope angle of etch face of the GaAs layer is $\theta_1 + \theta_2$. Etching was carried out by using an etchant having a volume ratio of $H_2SO_4$: $H_2O_2$: $H_2O$/1:8:1 at 20° C. After etching, the photomask 206 and the $Ga_{1-x}Al_xAs$ layer 204 were removed [FIG. 10(c)]. In this second example, the Al mol fraction x of the $Ga_{1-x}Al_xAs$ layer 204 was 0.5, and accordingly the groove profile obtained was perpendicular as shown. The grooves were 1.3 μm deep and 6 μm wide. On the wafer in which the grooves were formed, a p-type $Ga_{0.57}Al_{0.43}As$ cladding layer (first layer) 208, a nondope $Ga_{0.92}Al_{0.08}As$ active layer (second layer) 210, an n-type $Ga_{0.57}Al_{0.43}As$ cladding layer (third layer) 212, and an n-type GaAs contact layer (fourth layer) 214 were successively grown to the thicknesses of about 0.2 μm, about 0.05 μm, about 1.5 μm, and about 2 μm respectively in flat areas outside of the grooves by employing a liquid-phase epitaxial method. Thereafter, metal deposition was made for an n-side electrode, followed by alloy treatment, and an n-side ohmic electrode 216 was thus formed. On the substrate side, metal deposition was made for a p-side electrode, followed by alloy treatment, and a p-side ohmic electrode 218 was thus formed [FIG. 10(d)]. The semiconductor wafer thus produced was subjected to cleavage and then mounted on an Si block, being thus completed into a semiconductor device.

Figure 11:
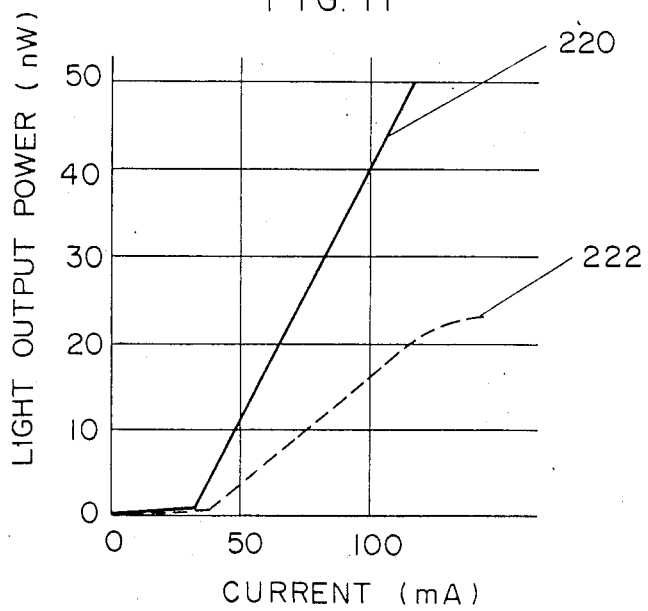
FIG. 11 is a diagram showing the optical outputcurrent characteristics of the device vis-a-vis a laser manufactured by a conventional method.

By performing chemical etching from above the $Ga_{1-x}Al_xAs$ layer as above described, it has now become possible to produce an inner stripe laser having perpendicular groove side-walls. In FIG. 11 are shown optical output-current characteristics of the semiconductor laser produced in this example and a conventional semiconductor laser having a slope profile. In the figure, 220 represents the characteristics of the laser produced in this second example, and 222 represents those of the conventional laser. Reduced side light absorption has resulted in considerable efficiency improvement and higher output.

Figure 12A:
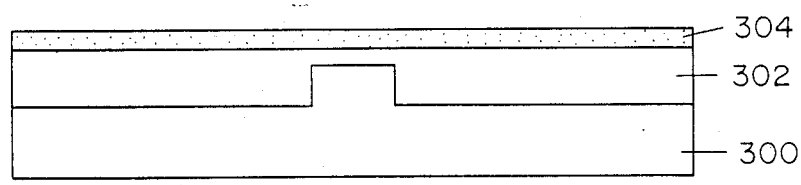
FIG. 12a, 12b and 12c are a sectional views showing the process of manufacturing a semiconductor laser device which represents a third example of the method of the invention.
Figure 12B:
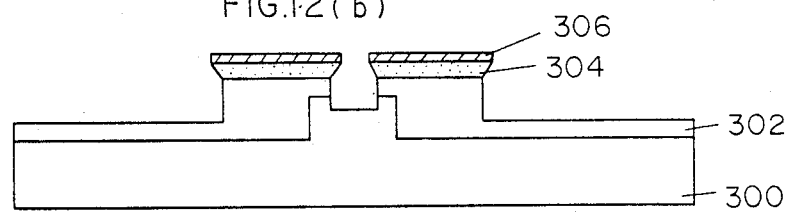
Figure 12C:
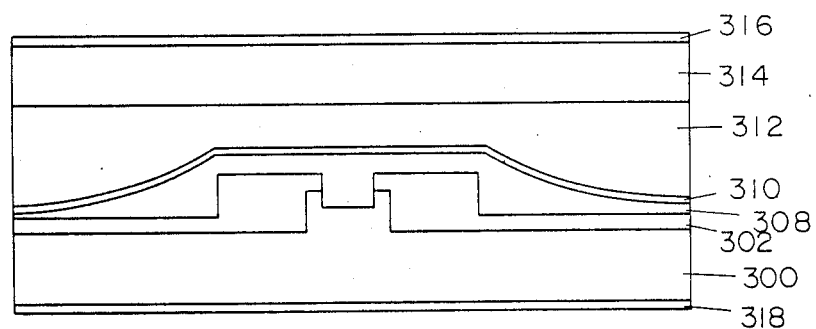

Nextly, a third example of the method of the invention, as employed in producing a buried ridge substrate laser, will be explained. FIG. 12 illustrates in section various steps involved in the method of manufacturing a semiconductor laser device.

An n-type GaAs layer 302 was grown by a liquid-phase epitaxial method on a p-type GaAs substrate 300 having stripe-form ridges in such manner as to obtain a flat surface. Then, a nondope $Ga_{0.5}Al_{0.5}As$ layer 304 was grown thereon [FIG. 12(a)]. Thereafter, through a photomask 306 chemical etching was performed in parallel to the direction of <011> and to a depth that the grooves are bottomed on the substrate 300 [FIG. 12(b)]. As in the second example, it is noted, the Al mol fraction of the GaAlAs layer 304 on the GaAs layer 302 was 0.5; therefore, two ridges having perpendicular side walls were formed. After the photomask 306 and the $Ga_{0.5}Al_{0.5}As$ layer 304 were removed, a p-type $Ga_{0.57}Al_{0.43}As$ cladding layer 308, a nondope $Ga_{0.92}Al_{0.08}As$ active layer 310, an n-type $Ga_{0.57}Al_{0.43}As$ cladding layer 312, and an n-type GaAs contact layer 314 were successively grown [FIG. 12(c)]. Subsequently, electrodes 306, 308 were formed. Thus, a buried twin ridge substrate laser having ridges with perpendicular side walls was completed.

As above described, the chemical etching method for semiconductor devices in accordance with the invention makes it possible to manufacture an inner stripe laser having perpendicular groove side-walls by chemical etching, that is, by performing such etching from above the $Ga_{1-x}Al_xAs$ layer formed on the GaAs layer, the method being thus of much practical significance in obtaining a high-efficiency and high-output laser.

In the above description, the layer-forming material has been limited to $Ga_{1-x}Al_xAs$. This invention is intended to control the slope angle of an etching profile formed by chemical etching, taking advantage of the relationship between crystalline anisotropy and mol fraction of the material. Therefore, any material may be conveniently used for the purpose of the invention if it is at least of the same zinc blende structure as $Ga_{1-x}Al_xAs$; for example, the material may be $In_{1-x}Al_xP$, $Ga_{1-x}Al_xSb$, $Ga_{1-x}Al_xP$, $GaP_xAs_{1-x}$, and so on.

While specific embodiments of the invention have been illustrated and described herein, it is realized that modifications and changes will occur to those skilled in the art. It is therefore to be understood that the appended claims are intended to cover all modifications and changes as fall within the true spirit and scope of the invention.

We claim:

1. A chemical etching method for a semiconductor device comprising:
   a step of forming a first layer of a mixed crystal of a Group III-V compound defined by the general formula $Q_{1(1-x)}Q_{2(x)}Q_3$ wherein $Q_1$, $Q_2$, $Q_3$ = Group III or V element; ($0 \leq x < 1$);
   a step of forming, on said first layer, a second layer of a mixed crystal of Group III-V compound layer having the same crystalline structure as said first layer and defined by the general formula $R_{1(1-y)}R_{2(y)}R_3$ wherein $R_1$, $R_2$, $R_3$ = Group III or V element; ($0 \leq y < 1$); and
   a step of chemically etching the layers, said etching being conducted downwardly from said second layer,
   the mol fraction y for said second layer being suitably determined relative to the mol fraction x for said first layer so that the etching profile of the first layer may have a desired slope angle.

2. The chemical etching method for a semiconductor device as set forth in claim 1, wherein $Q_1$ and $R_1$ are Ga, $Q_2$ and $R_2$ are Al, and $Q_3$ and $R_3$ are As.

3. The chemical etching method for a semiconductor device as set forth in claim 1, wherein $Q_1$ and $R_1$ are In, $Q_2$ and $R_2$ are Al, and $Q_3$ and $R_3$ are P.

4. The chemical etching method for a semiconductor device as set forth in claim 1, wherein both the first and the second layers have a surface (100) and wherein chemical etching is effected along the direction of <011>.

5. A chemical etching method for a semi-conductor device comprising:
   a step of forming a first layer of $Ga_{1-x}Al_xAs$ ($0 \leq x < 1$);
   a step of forming, on said first layer, a second layer of $Ga_{1-y}Al_yAs$ ($0 \leq y21\ 1$); and
   a step of chemically etching the layers, said etching being initiated at a level above said second layer,
   the mol fraction y for said second layer being suitably determined relative to the mol fraction x for said first layer so that the etching profile of the first layer may have a desired slope angle.

6. The chemical etching method for a semiconductor device as set forth in claim 5 wherein both the first and the second layers have a surface 100 and wherein chemical etching is effected along the direction of <011>.

7. A method of manufacturing a semiconductor laser device comprising:
   a step of forming on a semiconductor substrate having a surface (100)
   a first clad layer of $Ga_{1-x}Al_xAs$ ($0 < x < 1$),
   an activated layer of $Ga_{1-y}Al_yAs$ ($0 \leq y < 1$),
   a second clad layer of $Ga_{1-x}Al_xAs$ ($0 < x < 1$),
   a contact layer of GaAs, and
   a layer of $Ga_{1-z}Al_zAs$ ($0 < z < 1$)
   one over another in the order of mention; and
   a step of chemically etching the layers downwardly from said layer of $Ga_{1-z}Al_zAs$ and along the direction of <011> to form cavity facet the difference (z-x) between the mol fraction z of said $Ga_{1-z}Al_zAs$ layer and the mol fraction x of said two clad layers being selected between 0 and 0.2 so that the etched cavity facets is made perpendicular.

8. The method of manufacturing a semiconductor laser device as set forth in claim 7, wherein for the purpose of chemically etching along the direction of <011> a mask is formed which has edge oriented along the direction of <011>, said chemical etching being performed through said mask.

9. A method of manufacturing a semiconductor laser device comprising:
a steps of forming, on a GaAs layer formed on a semiconductor substrate and having a surface (100), a layer of $Ga_{1-x}Al_xAs$ having a mol fraction defined by the relation $0.1<x<0.6$;
a step of chemically etching the layer downwardly from a level above said $Ga_{1-x}Al_xAs$ layer along the direction of <011>, thereby forming grooves bottomed on said semiconductor substrate; and
a step of forming above said grooves a plurality of layers including an active layer.

10. The method of manufacturing a semiconductor laser device as set forth in claim 9, wherein said semiconductor substrate is a GaAs semiconductor substrate having a surface (100), on which substrate is epitaxially grown said GaAs layer having a surface (100).

11. The method of manufacturing a semiconductor laser device as set forth in claim 9, wherein a mixed solution of $H_2SO_4$, $H_2O_2$, and $H_2O$ is used as an etchant in said chemical etching.

12. The method of manufacturing a semiconductor laser device as set forth in claim 9, wherein the plurality of layers includes, from bottom and upward, a p-type GaAlAs clad layer, a non-dope GaAlAs activated layer, n-type GaAlAs cald layer, and n-type GaAs cap layer, said layers being successively grown one over another.

13. The method of manufacturing a semiconductor laser device as set forth in claim 9 wherein for the purpose of chemically etching along the direction of <011> a mask is formed which has edges oriented along the direction of <011>, said chemical etching being performed through said mask.

14. A chemical etching method for a semiconductor device comprising:
a step of forming a first layer of $Ga_{1-x}Al_xAs$ ($0 \leq x<1$);
a step of forming on said first layer a second layer of $Ga_{1-y}Al_yAs$ ($0 \leq y<1$); and
a step of chemically etching the layers downwardly from a level above said second layer,
the slope angle of etching face of said second layer being controlled by the mol fraction y of said second layer,
the slope angle of etching face of said first layer being controlled by the mol fraction x of said first layer and the mol fraction y of said second layer.

15. The chemical etching method for a semiconductor device as set forth in claim 14, wherein both the first and the second layers have a surface (100) and wherein chemical etching is effected along the direction of <011>.

16. A chemical etching method for a semiconductor device comprising:
a step of forming a first layer of $Ga_{1-x}Al_xAs$ ($0<x<1$ having a surface (100);
a step of forming on said first layer a second layer of GaAs having a surface (100);
a step of forming on said second layer a third layer of $Ga_{1-z}Al_zAs$ ($0<z<1$); and
a step of chemically etching the layers downwardly from said third layer and along the direction of <011>,
the slope angle of etch face of said first layer being controlled by controlling the difference (z-x) between the mol fraction z of said third layer and the mol fraction x of said first layer.

17. The chemical etching method for a semiconductor device as set forth in claim 16, wherein said mol fraction difference (z-x) is selected between 0 and 0.2 so that the etching face of said first layer is perpendicular.

18. The chemical etching method for a semiconductor device as set forth in claim 5, wherein said first layer is GaAs and the mol fraction y of said second layer is $0.1<y<0.6$, so that the etch face of said first layer is perpendicular.

19. The chemical etching method for a semiconductor device as set forth in claim 1, wherein the component material of each individual layer is crystallographically, a zinc blende structure.

* * * * *